United States Patent
Do

[11] Patent Number: 6,166,967
[45] Date of Patent: Dec. 26, 2000

[54] MULTI-BANK TESTING APPARATUS FOR A SYNCHRONOUS DRAM

[75] Inventor: Chang Ho Do, Ichon-shi, Rep. of Korea

[73] Assignee: Hyundi Electronics Industries Co., Ltd., Kyoungki-do, Rep. of Korea

[21] Appl. No.: 09/316,389

[22] Filed: May 21, 1999

[30] Foreign Application Priority Data

May 25, 1998 [KR] Rep. of Korea ...................... 98-18885

[51] Int. Cl.[7] .................................................... G11C 7/00
[52] U.S. Cl. ................ 365/189.07; 365/201; 365/230.03
[58] Field of Search .............................. 365/189.07, 193, 365/201, 230.03

[56] References Cited

U.S. PATENT DOCUMENTS

| | | | |
|---|---|---|---|
| 5,511,029 | 4/1996 | Sawada et al. ........................ | 365/201 |
| 5,587,950 | 12/1996 | Sawada et al. ........................ | 365/201 |
| 5,802,005 | 9/1998 | Nakamura et al. ................. | 365/230.03 |
| 5,959,930 | 9/1999 | Sakurai .............................. | 365/230.03 |

*Primary Examiner*—Son Mai
*Attorney, Agent, or Firm*—Nath & Associates; Gary M. Nath; Harold L. Novick

[57] ABSTRACT

A multi-bank testing apparatus for a synchronous DRAM, which allows all banks of the synchronous DRAM to simultaneously carry out their write and read operations in a test mode, thereby being capable of testing the entire bank in order to reduce the test time being likely to increase in accordance with an increased memory integration degree. The multi-bank testing apparatus includes a row address strobe generating unit for enabling a word line to transmit data from cells to bit line sense amplifiers in each bank of the synchronous DRAM, a column address strobe generating unit for generating a signal adapted to enable transistors respectively adapted to couple bit lines carrying data, amplified by the bit line sense amplifiers, to local data bus lines, input/output sense amplifiers for amplifying data on the local data bus lines, respectively, a transmission gate unit for controlling transmission of data from the input/output sense amplifiers to global read data bus lines, and an input/output comparing unit for compressing data from the input/output sense amplifiers prior to the transmission thereof to the global read data bus lines.

8 Claims, 7 Drawing Sheets

MULTI-BANK TESTING APPARATUS FOR A SYNCHRONOUS DRAM

BACKGROUND OF THE INVENTION

1. Field of the Invention

The present invention relates to an apparatus for testing a synchronous dynamic random access memory (DRAM) which is a semiconductor memory, and more particularly to a multi-bank testing apparatus for a synchronous DRAM, which allows all banks of the synchronous DRAM to simultaneously carry out their write and read operations in a test mode, thereby being capable of testing the entire bank in order to reduce the test time being likely to increase in accordance with an increased memory integration degree.

2. Description of the Related Art

Generally, a synchronous DRAM includes a plurality of row address strobe (RAS) generating circuits corresponding respectively to banks of the synchronous DRAM. Each of the RAS-generating circuits is enabled in response to a bank selection address signal adapted to select a bank associated with the RAS-generating circuit, thereby establishing row paths for the selected bank. The synchronous DRAM also includes a plurality of column address strobe (CAS) generating circuits corresponding respectively to the banks of the synchronous DRAM. Each of the CAS-generating circuits is enabled in response to a bank selection address signal adapted to select a bank associated with the CAS-generating circuit, thereby establishing column paths for the selected bank.

Figure 1:
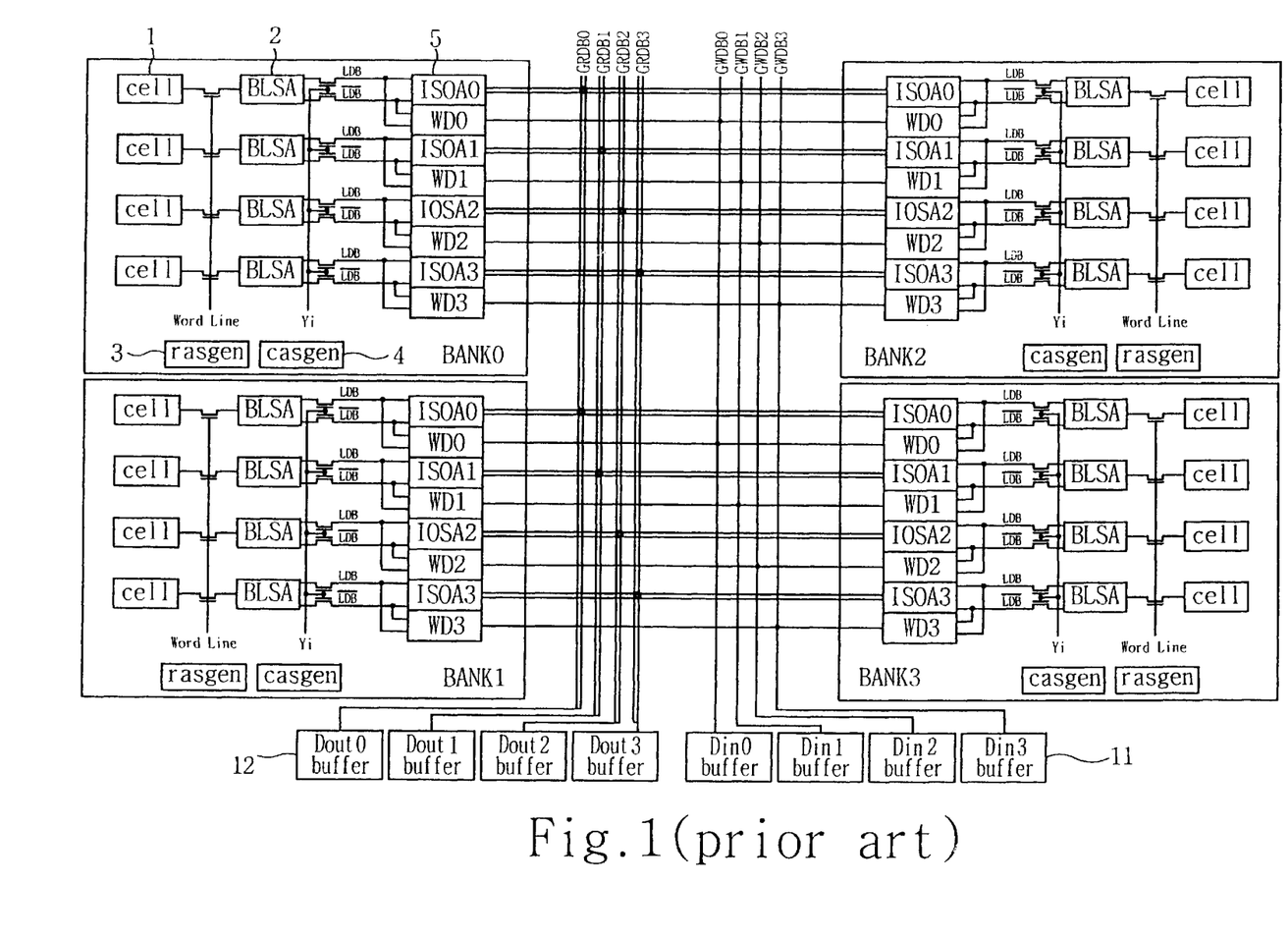
FIG. 1, is a block diagram illustrating a configuration of a general synchronous DRAM.
Figure 2:
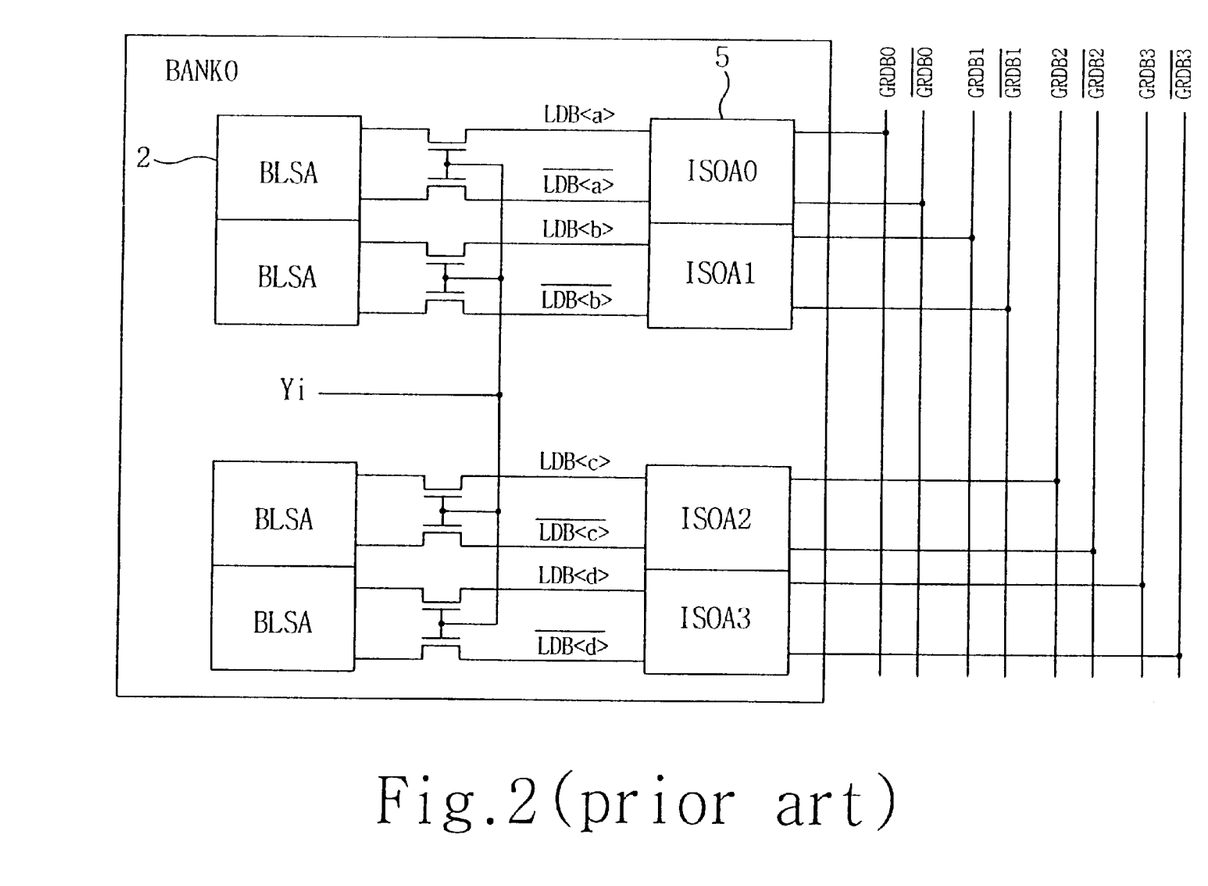
FIG. 2 is a block diagram illustrating output paths for input/output sense amplifiers shown in FIG. 1.

The above operations of the row and column address strobe generating circuits will now be described in conjunction with FIGS. 1 and 2.

When a row active command is inputted to a synchronous DRAM in a normal operation mode, it enables a row address strobe signal which is a command signal for enabling RAS-generating circuits. This row address strobe signal is applied to RAS-generating circuits (denoted by "rasgen" in FIG. 1) 3 of all banks in the synchronous DRAM. Simultaneously, a bank selection address signal, which selects one of the banks, is applied to RAS-generating circuits 3 of all banks. Only the RAS-generating circuit 3 of the bank selected by the received bank selection address signal is enabled, based on the received row address strobe signal, to output a row address strobe enable signal, thereby establishing row paths for the selected bank. As a result, a word line associated with the enabled bank is enabled.

On the other hand, when a column active command is inputted to the synchronous DRAM, it enables a column address strobe signal which is a command signal for enabling CAS-generating circuits. This column address strobe signal is applied to CAS-generating circuits (denoted by "casgen" in FIG. 1) 4 of all banks in the synchronous DRAM. Simultaneously, a bank selection address signal, which selects one of the banks, is applied to CAS-generating circuits 4 of all banks. Only the CAS-generating circuit 4 of the bank selected by the received bank selection address signal is enabled, based on the received column address strobe signal, to output a column address strobe enable signal, thereby establishing column paths for the selected bank. As a result, a signal Yi, serving to couple each of bit lines to an associated one of local data bus lines LDB in an enable state thereof, is enabled. Accordingly, it is possible to carry out data read and write operations for the selected bank.

The above-mentioned data paths will be described in more detail, in conjunction with FIG. 1.

First, a description will be made in regard to the write paths.

Buffered data from each of data input buffers 11 is sent to an associated one of global write data bus lines GWDB, and is then sent to an associated one of local data bus lines LDB in accordance with an operation of an associated one of write drivers WD.

In this state, when the signal Yi, serving to couple each local data bus line LDB to an associated one of bit lines in an enable state thereof, is enabled, the data from each local data bus line LDB is applied to an associated one of cells 1 via an associated bit line, so that it is stored in the associated cell 1.

Next, a description will be made in regard to the read paths.

When data from each cell 1 in a selected bank is sent to an associated bit line in accordance with a row active command, the signal Yi is enabled in response to the row active command, thereby causing the data from the bit line to be transmitted to an associated local data bus line LDB. The data from the local data bus line LDB is then sent to an associated input/output sense amplifier 5 which, in turn, amplifies the data. The amplified data is subsequently transmitted to an associated global read data bus line GRDB, so that it is output through an associated data output buffer 12.

As mentioned above, a synchronous DRAM, which consists of Nbanks, conducts row and column activating operations for only one particular bank selected by a bank selection address BA every time the bank selection address BA is generated. For this reason, the testing operation for such a synchronous DRAM is carried out for one bank.

In order to test the entire bank of the synchronous DRAM, it is necessary to conduct the testing operation by N times corresponding to the number of banks in the synchronous DRAM. This results in a lengthened test time.

SUMMARY OF THE INVENTION

Therefore, the present invention has been made in view of the above-mentioned problems involved in conventional techniques, and an object of the invention is to provide a multi-bank testing apparatus for a synchronous DRAM which allows all banks of the synchronous DRAM to simultaneously carry out their write and read operations in a test mode, thereby being capable of testing the entire bank in order to reduce the test time being likely to increase in accordance with an increased memory integration degree.

In accordance with the present invention, this object is accomplished by providing a multi-bank testing apparatus for a synchronous DRAM consisting of a plurality of banks, comprising: a row address strobe generating unit for enabling a word line to transmit data from cells to bit line sense amplifiers in each bank of said synchronous DRAM; a column address strobe generating unit for generating a signal adapted to enable transistors respectively adapted to couple bit lines carrying data, amplified by said bit line sense amplifiers, to local data bus lines; input/output sense amplifiers for amplifying data on said local data bus lines, respectively; a transmission gate unit for controlling transmission of data from said input/output sense amplifiers to global read data bus lines; and an input/output comparing unit for compressing data from said input/output sense amplifiers prior to said transmission thereof to said global read data bus lines.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Referring to FIGS. 3a to 8, circuits included in an apparatus for testing banks of a synchronous DRAM in accordance with the present invention are illustrated, respectively.

The testing apparatus of the present invention includes a RAS-generating unit 30 (FIG. 3a) for enabling a word line to transmit data from cells to bit line sense amplifiers 20 in each bank of a synchronous DRAM, a CAS-generating unit 40 (FIG. 4a) for generating a signal adapted to enable transistors respectively adapted to couple bit lines carrying data, amplified by the bit line sense amplifiers 20, to local data bus lines LDB, and input/output sense amplifiers 50 for amplifying data on the local data bus lines LDB, respectively. The testing apparatus also includes a transmission gate unit 60 for controlling transmission of data from the input/output sense amplifiers 50 to global read data bus lines GRDB. The testing apparatus further includes an input/output comparing unit 70 for compressing data from the input/output sense amplifiers 50 prior to the transmission thereof to the global read data bus lines GRDB.

Figure 3A:
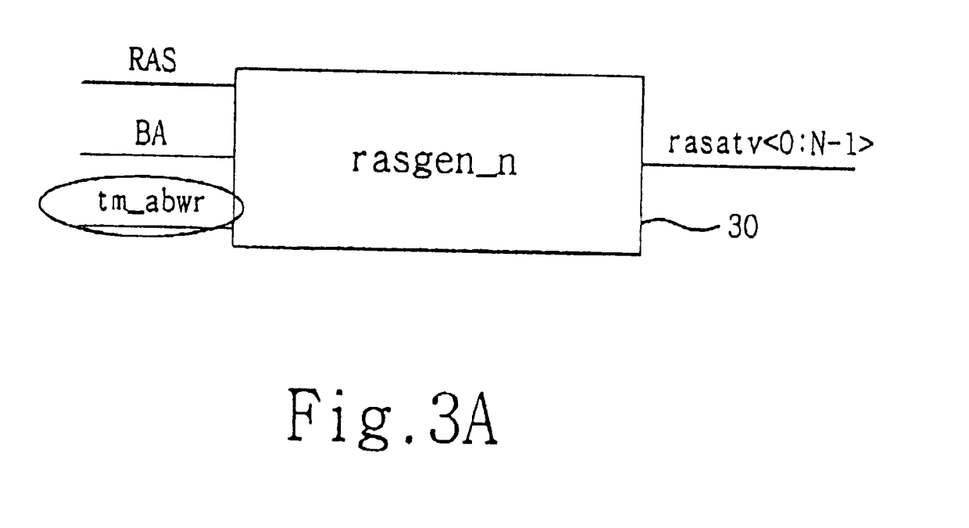
FIGS. 3a and 3b are diagrams illustrating a configuration of a RAS-generating circuit unit included in a multi-bank testing apparatus according to the present invention.
Figure 3B:
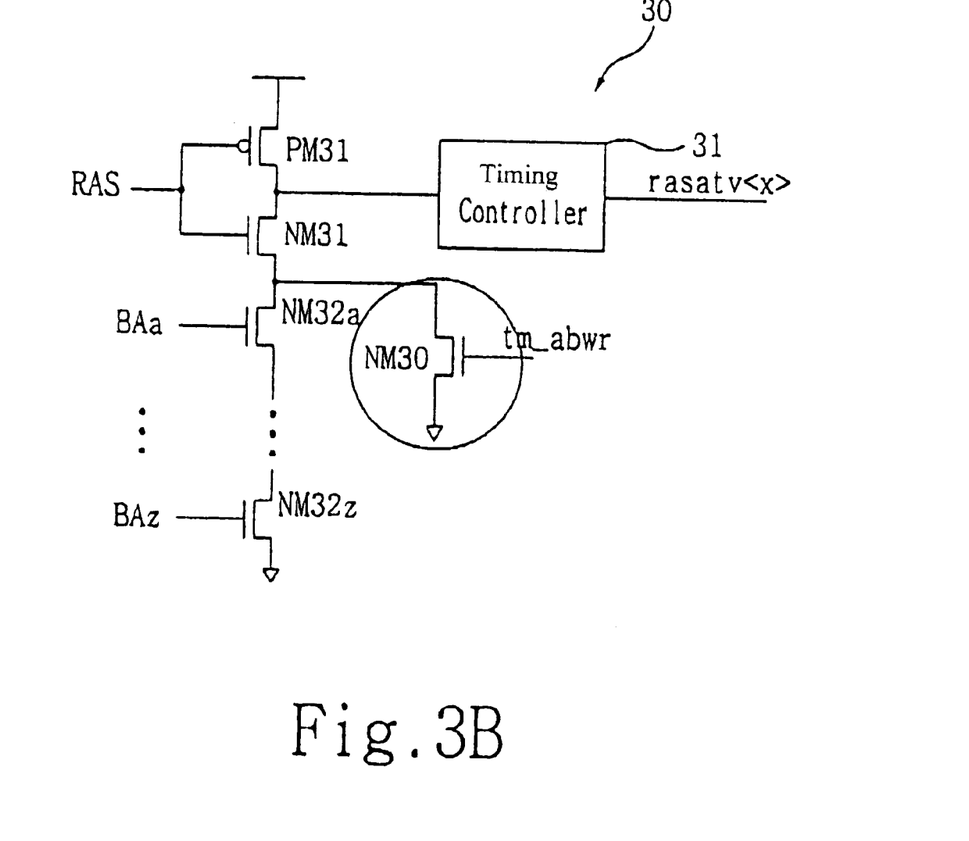

As shown in FIG. 3b, the RAS-generating unit 30 includes a PMOS transistor PM31 and an NMOS transistor NM31 connected in series to each other. A row address strobe signal is commonly applied to the gates of the PMOS transistor PM31 and the NMOS transistor NM31. A timing controller 31 is coupled to a node between the PMOS transistor PM31 and the NMOS transistor NM31. The timing controller 31 serves to control the period of time for which an output from the RAS-generating unit 30, namely, a row address strobe enable signal rasatv, is in an enable state. A plurality of NMOS transistors NM32a to NM32z, which are coupled in series together, is connected in series to the NMOS transistor NM 31. Each of the NMOS transistors NM32a to NM32z receives an associated one of bank selection address signals BAa to BAz at its gate. Another NMOS transistor NM30 is coupled to a node between the NMOS transistor NM31 and the NMOS transistor NM32a in a parallel fashion. The NMOS transistor NM30 receives, at its gate, a test signal for all banks (hereinafter, referred to as a "all-bank test signal"), tm_abwr. The all-bank test signal tm_abwr is enabled when write and read operations are to be conducted for all banks.

Figure 4A:
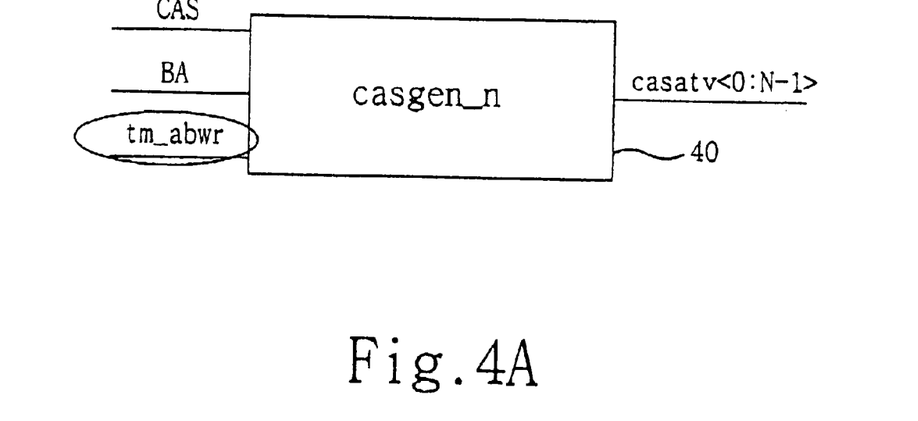
FIGS. 4a and 4b are diagrams illustrating a configuration of a CAS-generating circuit unit included in the multi-bank testing apparatus according to the present invention.
Figure 4B:
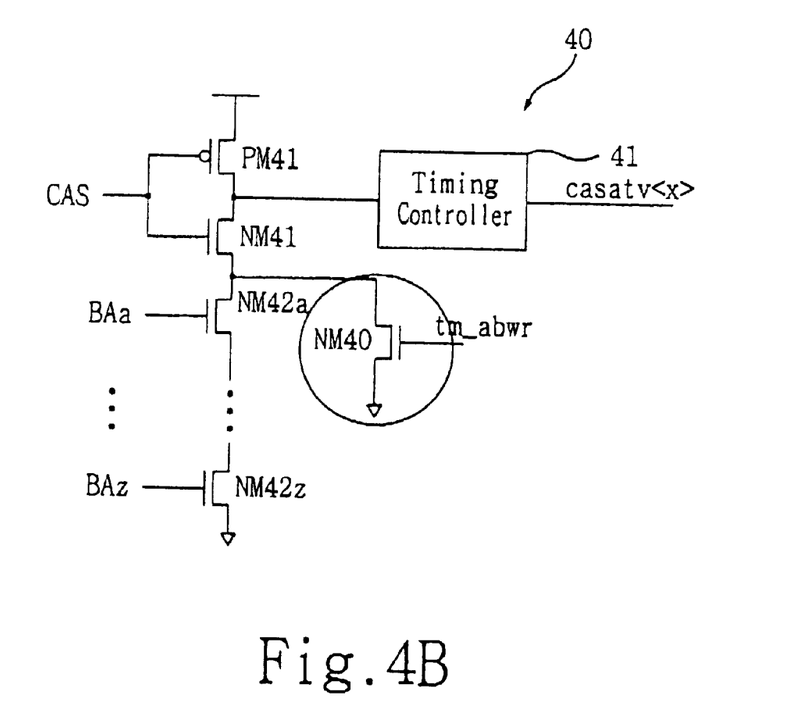

Referring to FIG. 4b, a detailed configuration of the CAS-generating unit 40 is illustrated. As shown in FIG. 4b, the CAS-generating unit 40 includes a PMOS transistor PM41 and an NMOS transistor NM41 connected in series to each other. A column address strobe signal is commonly applied to the gates of the PMOS transistor PM41 and the NMOS transistor NM41. A timing controller 41 is coupled to a node between the PMOS transistor PM41 and the NMOS transistor NM41. The timing controller 41 serves to control the period of time for which an output from the CAS-generating unit 40, namely a column address strobe enable signal casatv, is in an enable state. A plurality of NMOS transistors NM42a to NM42z, which are coupled in series together, is connected in series to the NMOS transistor NM 41. Each of the NMOS transistors NM42a to NM42z receives an associated one of bank selection address signals BAa to BAz at its gate. Another NMOS transistor NM40 is coupled in parallel to a node between the NMOS transistor NM41 and NMOS transistor NM42a. The NMOS transistor NM40 receives, at its gate, the all-bank test signal tm_abwr enabled when write and read operations are to be conducted for all banks.

Figure 5:
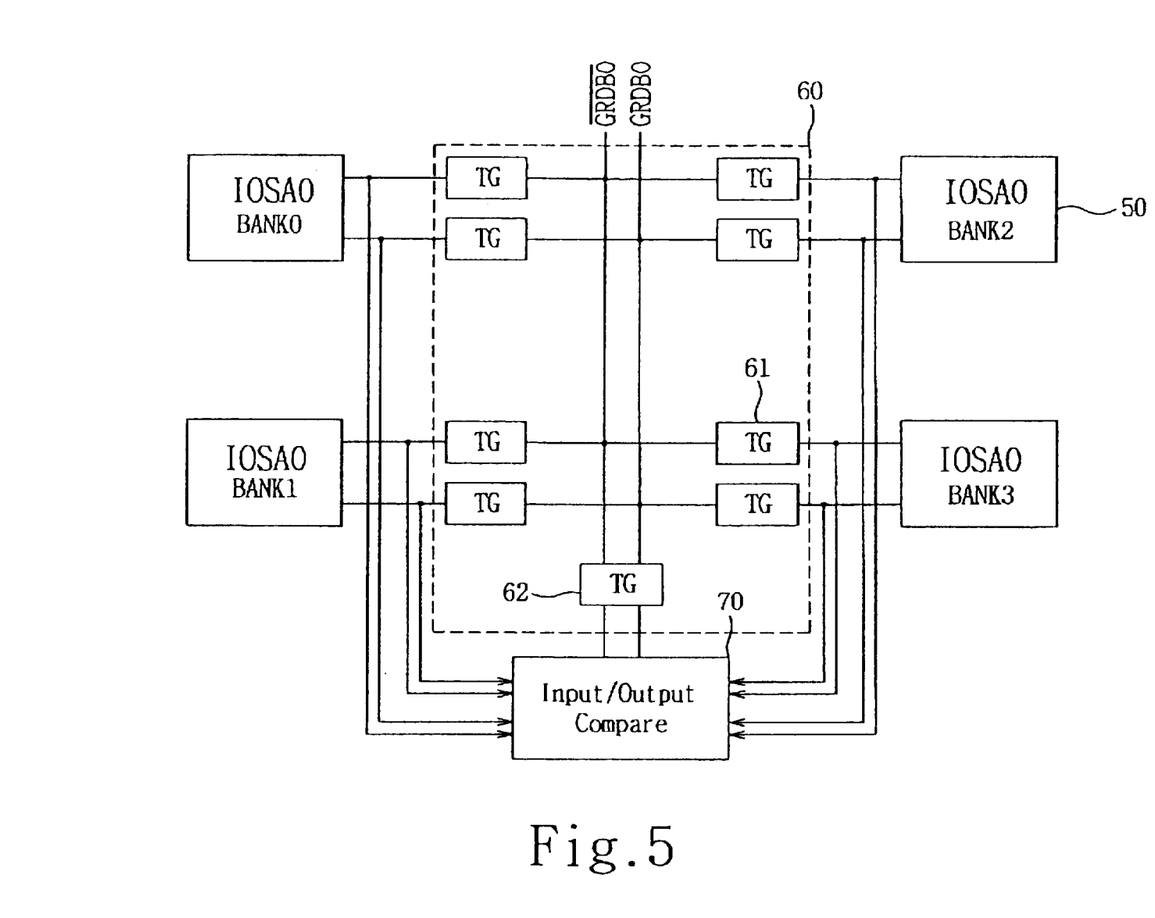
FIG. 5 is a block diagram illustrating output paths for input/output sense amplifiers in accordance with an embodiment of the present invention.
Figure 6:
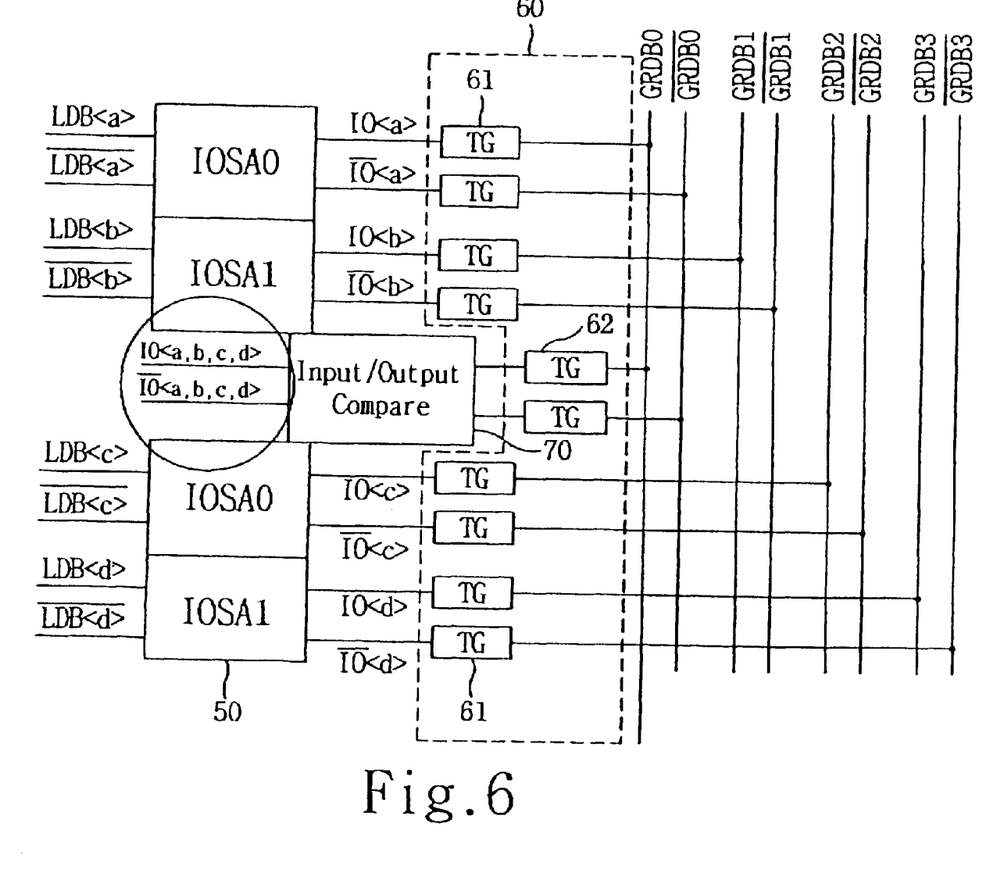
FIG. 6 is a block diagram illustrating output paths for input/output sense amplifiers in accordance with another embodiment of the present invention.
Figure 7:
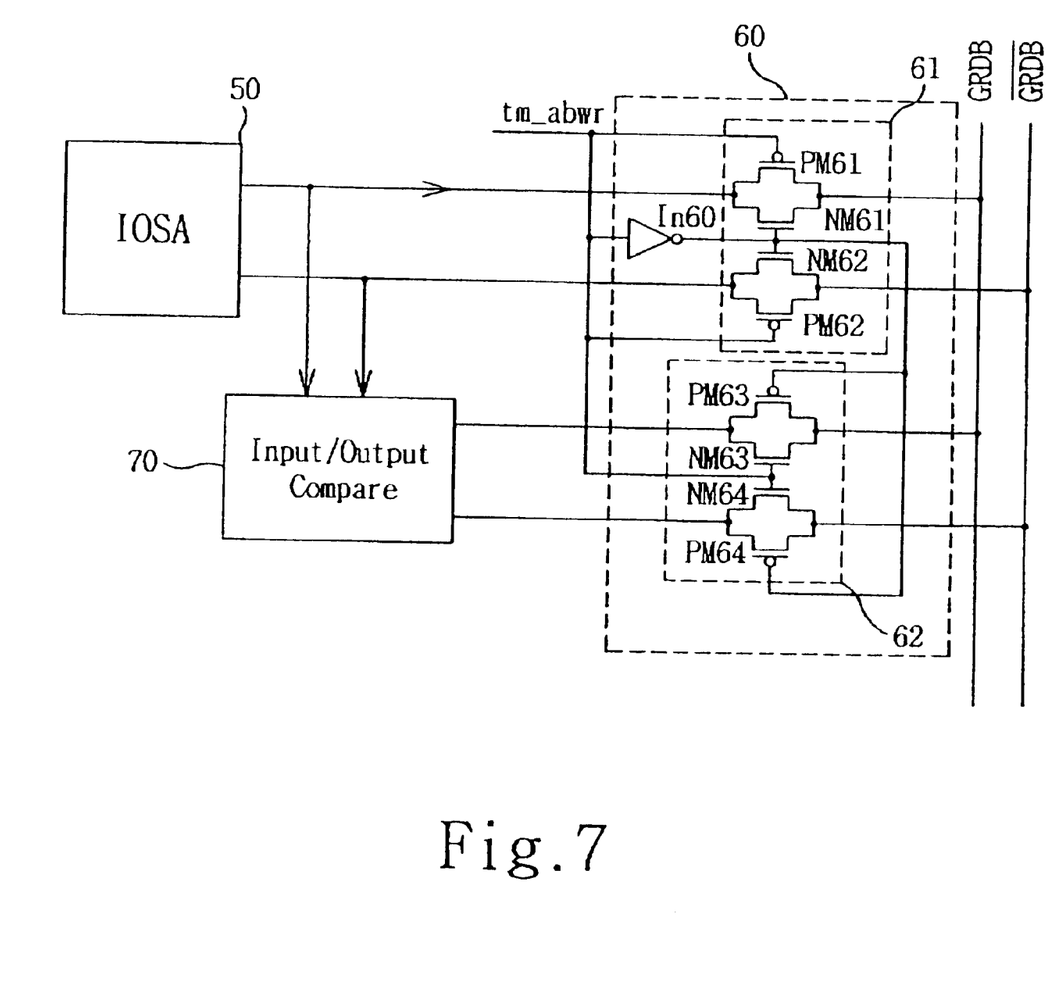
FIG. 7 is a circuit diagram illustrating a configuration of a transmission gate unit included in the multi-bank testing apparatus according to the present invention.

As described more fully with respect to FIG. 7, the transmission gate unit 60 includes a plurality of first transmission gates 61 and a pair of second transmission gates 62. As shown in FIGS. 5 and 6, each first transmission gate 61 is arranged between the output of an associated input/output sense amplifier 50 and an associated global read data bus line GRDB or bar-capped GRDB. In a test mode, the first transmission gate 61 is closed, thereby preventing data from the associated input/output sense amplifier 50 from being transmitted to the associated global read data bus line GRDB or bar-capped GRDB. On the other hand, each second transmission gate 62 is arranged between the output of the input/output comparing unit 70 and an associated input/output global read data bus line GRDB or bar-capped GRDB. The second transmission gate 62 is opened in the test mode, thereby allowing the output from the input/output comparing unit 70 to be transmitted to the associated global read data bus line GRDB or bar-capped GRDB.

Referring to FIG. 7, a detailed configuration of each first transmission gate 61 and each second transmission gate 62 included in the transmission gate unit 60 is illustrated. As shown in FIG. 7, the first transmission gate 61 includes a PMOS transistor PM61 and an NMOS transistor NM61 coupled in parallel between an associated one of the input/output sense amplifiers 50 and one of two global read data bus lines GRDB and bar-capped GRDB respectively associated with input and input-bar signals from the input/output sense amplifier 50, that is, the global read data bus line GRDB. At its gate, the PMOS transistor PM61 receives the all-bank test signal tm_abwr whereas the NMOS transistor NM61 receives, at its gate, a signal inverted from the all-bank test signal tm_abwr via an inverter In60. The first transmission gate 61 also includes another PMOS transistor PM62 and another NMOS transistor NM62 coupled in parallel between the associated input/output sense amplifier 50 and the other associated global read data bus line, bar-capped GRDB. At its gate, the PMOS transistor PM62 receives the all-bank test signal tm_abwr whereas the NMOS transistor NM62 receives, at its gate, the signal inverted from the all-bank test signal tm_abwr via the inverter In60. On the other hand, the second transmission gate 62 includes a PMOS transistor PM63 and an NMOS transistor NM63 coupled in parallel between the input/output comparing unit 70 and the global read data bus line GRDB. The PMOS transistor PM63 receives, at its gate, the signal inverted from the all-bank test signal tm_abwr via the inverter In60 whereas the NMOS transistor NM63 receives, at its gate, the all-bank test signal tm_abwr. The second transmission gate 62 further includes another PMOS transistor PM64 and another NMOS transistor NM64 coupled in parallel between the input/output comparing unit 70 and the other global read data bus line, bar-capped GRDB. The PMOS transistor PM64 receives, at its gate, the signal inverted from the all-bank test signal tm_abwr via the inverter In60 whereas the NMOS transistor NM64 receives, at its gate, the all-bank test signal tm_abwr.

Figure 8:
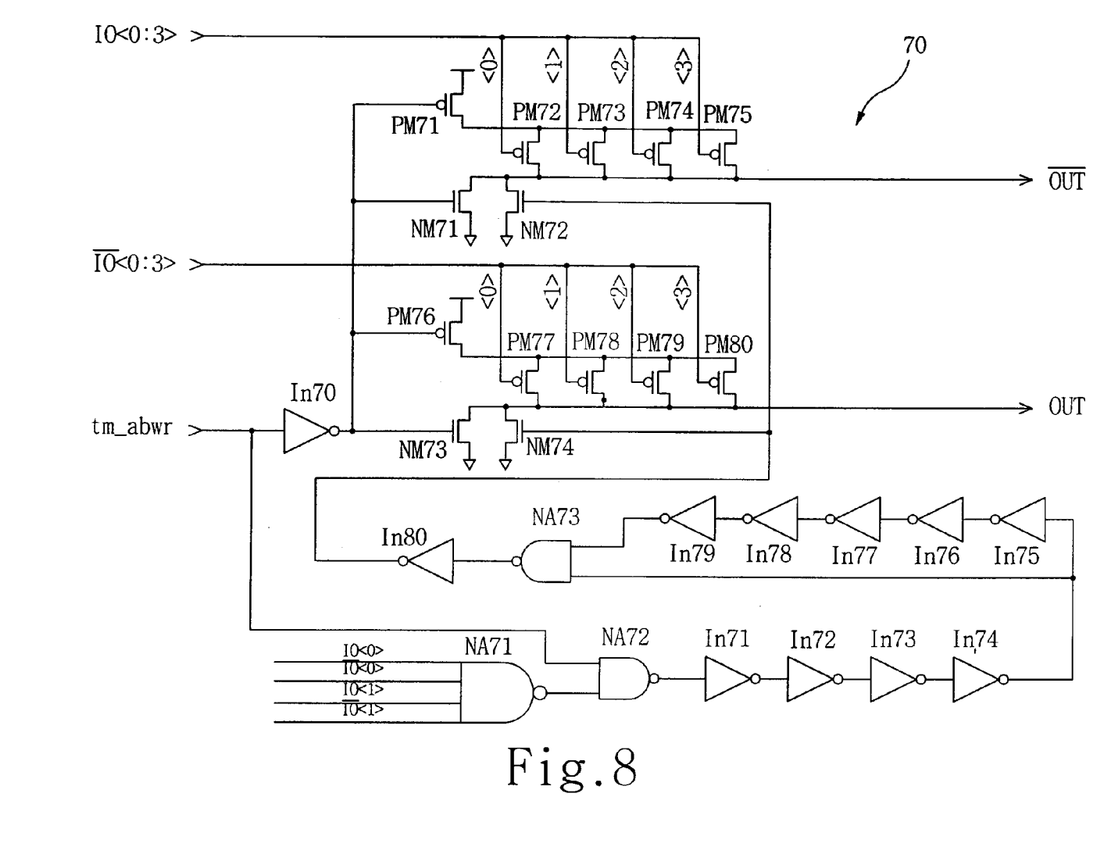
FIG. 8 is a circuit diagram illustrating a configuration of an input/output comparing unit included in the multi-bank testing apparatus according to the present invention.

FIG. 8 illustrates a detailed configuration of the input/output comparing unit 70. As shown in FIG. 8, the input/output comparing unit 70 includes PMOS transistors PM71 and PM 76, and NMOS transistors NM71 and NM73. These PMOS and NMOS transistors PM71, PM76, NM71, and NM76 are coupled together in parallel and receive, at respective gates thereof, a signal inverted from the all-bank test signal tm_abwr via an inverter In70. A plurality of PMOS transistors PM72 to PM75 is coupled in parallel between the PMOS transistor PM71 and the NMOS transistor NM71. The PMOS transistors PM 72 to PM75 receive, at respective gates thereof, input signals IO<0:3>which are output from associated input/output sense amplifiers 50, respectively. An NMOS transistor NM72 is connected to the NMOS transistor NM71 in such a fashion that they have a common source. A plurality of PMOS transistors PM77 to PM80 is coupled in parallel between the PMOS transistor PM76 and NMOS transistor NM73. The PMOS transistors PM 77 to PM80 receive, at respective gates thereof, input-bar signals, bar-capped IO<0:3>, which are output from the associated input/output sense amplifiers 50, respectively. An NMOS transistor NM74 is connected to the NMOS transistor NM73 in such a fashion that they have a common source. The input/output comparing unit 70 also includes NAND gates NA71, NA72, and NA73. The NAND gate 71 receives output and output-bar signals from the associated input/output sense amplifiers 50. The NAND gate NA72 receives an output from the NAND gate NA71 along with the all-bank test signal tm_abwr. The NAND gate NA73 receives an output from the NAND gate NA72 via serially connected inverters In71 to In74 at one input thereof. The output from the NAND gate NA72 is also applied to the other input of the NAND gate NA73 via the serially connected inverters In71 to In74 and then via serially connected inverters In75 to In79. The output from the NAND gate NA73 is coupled to the gates of the NMOS transistors NM72 and NM74 in a common fashion via an inverter In80.

In accordance with the above-mentioned configuration according to the present invention, row and column activating operations may not be influenced by any bank selection address during write and read testing operations. That is, the row or column activating operation can be conducted for all banks in a simultaneous manner, thereby enabling a simultaneous read or write test.

That is, in accordance with the present invention, all word lines, in all banks, associated with one row address, can be enabled in every row activating operation. In every column-activating operation, the signal Yi which serves to couple each of bit lines to an associated one of local data bus lines LDB in an enable state thereof is enabled for all banks. Accordingly, the write or read test can be conducted for all banks.

In order to prevent data from different banks from fighting with each other on a data output path, data from each cell passes through the input/output comparing unit, before it is transmitted to an associated global read data bus line, so that it is compressed in the input/output comparing unit. Since compressed data is transmitted to global read data bus lines, there is no data fighting phenomenon occurring in data output paths.

By one write or read cycle, a corresponding write or read operation is completed for all banks. Accordingly, it is possible to greatly reduce the entire test time.

Now, the operation of the testing apparatus according to the present invention will be described.

When a row active command is inputted to the testing apparatus in a normal operation mode, it enables a row address strobe signal which is, in turn, applied to the RAS-generating unit 30. Based on the row address strobe signal, the RAS-generating unit 30 generates a row address strobe enabling signal rasatv.

On the other hand, when a column active command is inputted is inputted to the testing apparatus in a normal operation mode, it enables a column address strobe signal which is, in turn, applied to the CAS-generating unit 40. Based on the column address strobe signal, the CAS-generating unit 30 generates a column address strobe enabling signal casatv.

In a test mode in which write and read operations for tests are to be carried out for all banks, an all-bank test signal tm_abwr is enabled. This all-bank test signal tm_abwr is applied to respective gates of the NMOS transistors NM30 and NM40 coupled to respective nodes of the RAS and CAS-generating units 30 and 40, to which a bank selection address signal BA is applied, in a parallel fashion. In this mode, accordingly, row and column activating operations are not influenced by any bank selection address.

In accordance with the above-mentioned configurations of the RAS and CAS-generating units 30 and 40, a chip consisting of N banks can operate such as one bank during write and read tests for all banks. When a write command is inputted, cells included in different banks, but allocated with the same address, are recorded with the same data because each global write data bus line GWDB belongs to all banks.

Accordingly, data write is conducted for all banks in a simultaneous manner, thereby enabling a simultaneous write test.

When a read operation is subsequently carried out, data from cells included in different banks, but allocated with the same address, are carried on associated bit lines in an amplified state, and then transmitted to associated local data bus lines LDB, respectively, in response to an enabled state of the signal Yi serving to couple each of those bit lines to an associated one of local data bus lines LDB.

The data from each local data bus line LDB is then amplified in an associated input/output sense amplifier 50 which, in turn, sends the resultant data to the input/output comparing unit 70.

In the test mode, each first transmission gate 61, which serves to couple the output of an associated input/output sense amplifier 50 to an associated global read data bus line GRDB, is closed in response to the all-bank test signal tm_abwr, thereby preventing data from the associated input/output sense amplifier 50 from being transmitted to the associated global read data bus line GRDB. On the other hand, each second transmission gate 62, which serves to couple the output of the input/output comparing unit 70 to an associated input/output global read data bus line GRDB, is opened in response to the all-bank test signal tm_abwr, thereby allowing the output from the input/output comparing unit 70 to be transmitted to the associated global read data bus line GRDB. Thus, a data read operation is conducted for all banks in a simultaneous manner.

The input stage of the input/output comparing unit 70 may have various configurations in accordance with the present invention.

In accordance with an embodiment of the present invention, respective outputs of input/output sense amplifiers 50 respectively included in different banks, but arranged on the same data path, are coupled to the input of the input/output comparing unit 70.

This configuration is illustrated in FIG. 5. In this case, the input/output comparing unit 70 receives, as its input, data from input/output sense amplifiers 50, each being included in one of all banks, carried on the same global data bus line GRDB, as shown in FIG. 5.

In this case, it is possible to conduct a data write operation in the testmode, irrespective of the logic level of data to be written, that is, whether data to be written has a low logic level or a high logic level. In a data read operation, the written data can be read in such a fashion that their logic levels are read.

In accordance with another embodiment of the present invention, respective outputs of input/output sense amplifiers 50 included in the same bank are coupled to the input/output comparing unit 70. This configuration is illustrated in FIG. 6.

In the case illustrated in FIG. 6, it is necessary to input data having the same logic level in a write operation in the test mode.

In accordance with the multi-bank test system, which is applied to synchronous DRAMs, it is possible to greatly reduce the entire test time, as compared to conventional test systems in which a test is carried out in a special test mode using compressed output data.

As apparent from the above description, the present invention provides a multi-bank testing apparatus for a synchronous DRAM, which allows all banks of the synchronous DRAM to simultaneously carry out their write and read operations in a test mode, thereby being capable of testing the entire bank in order to reduce the test time being likely to increase in accordance with an increased memory integration degree. In order to prevent data from different banks from fighting with each other on a data output path, data from each cell passes through an input/output comparing unit before it is transmitted to an associated global read data bus line, so that it is compressed in the input/output comparing unit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-bank testing apparatus for a synchronous DRAM consisting of a plurality of banks, comprising:
 a row address strobe generating unit for generating a signal adapted to simultaneously enable all of word lines having a same row address of each bank each bank to transmit data from cells to bit line sense amplifiers in each bank of said synchronous DRAM;
 a column address strobe generating unit for generating a signal adapted to enable transistors respectively adapted to simultaneously coupled bit lines having a same column address of each bank and carrying data, amplified by said bit line sense amplifiers, to local data bus lines;
 input/output sense amplifiers for amplifying data on said local data bus lines, respectively;
 input/output sense amplifiers for amplifying data on said local data bus lines, respectively;
 a transmission gate unit for controlling transmission of data from said input/output sense amplifiers to global read data bus lines; and
 an input/output comparing unit for compressing data from said input/output sense amplifiers prior to said transmission thereof to said global read data bus lines.

2. The multi-bank testing apparatus as claimed in claim 1, wherein said row address strobe generating unit comprises:
 a first PMOS transistor and a first NMOS transistor connected in series to each other, said first PMOS and NMOS transistors receiving a row address strobe signal in a common fashion at gates thereof;
 a timing controller coupled to a node between said first PMOS and NMOS transistors and adapted to control the period of time for which an output from said row address strobe generating unit;
 a group of second NMOS transistors coupled in series together and connected in series to said first NMOS transistor, each of said second NMOS transistors receiving an associated one of bank selection address signals at a gate thereof;
 a third NMOS transistor coupled to a node between said first NMOS transistor and said second NMOS transistor group in a fashion parallel to said second NMOS transistor group, said third NMOS transistor receiving, at a gate thereof, an all-bank test signal being enabled when write and read operations in a test mode are to be conducted for all banks.

3. The multi-bank testing apparatus as claimed in claim 1, wherein said column address strobe generating unit comprises:
 a first PMOS transistor and a first NMOS transistor connected in series to each other, said first PMOS and NMOS transistors receiving a column address strobe signal in a common fashion at gates thereof;
 a timing controller coupled to a node between said first PMOS and NMOS transistors and adapted to control the period of time for which an output from said column address strobe generating unit;
 a group of second NMOS transistors coupled in series together and connected in series to said first NMOS transistor, each of said second NMOS transistors receiving an associated one of bank selection address signals at a gate thereof;
 a third NMOS transistor coupled to a node between said first NMOS transistor and said second NMOS transistor group in a fashion parallel to said second NMOS transistor group, said third NMOS transistor receiving, at a gate thereof, an all-bank test signal being enabled when write and read operations in a test mode are to be conducted for all banks.

4. The multi-bank testing apparatus as claimed in claim 1, wherein said transmission gate unit comprises:
 a plurality of first transmission gates each arranged between an output of an associated one of said input/ output sense amplifiers and an associated one of said global read data bus lines, each of said first transmission gates being closed in response to an all-bank test signal being enabled when write and read operations in a test mode are to be conducted for all banks, thereby preventing data from said associated input/output sense amplifier from being transmitted to said associated global read data bus line; and a pair of second transmission gates each arranged between an output of said input/output comparing unit and an associated one of said input/output global read data bus lines, each of said second transmission gates being opened by said all-bank test signal, thereby allowing said output from said input/output comparing unit to be transmitted to said associated global read data bus line.

5. The multi-bank testing apparatus as claimed in claim 4, wherein:

each of said first transmission gate comprises
a first PMOS transistor and a first NMOS transistor coupled in parallel between said associated input/output sense amplifier and a first one of two global read data bus lines respectively associated with input and input-bar signals from said input/output sense amplifier, said first PMOS transistor receiving, at a gate thereof, said all-bank test signal while said first PMOS transistor receiving, at a gate thereof, a signal inverted from said all-bank test signal via an inverter, and a second PMOS transistor and a second NMOS transistor coupled in parallel between said associated input/output sense amplifier and a second one of said associated global read data bus lines, said second PMOS transistor receiving, at a gate thereof, said all-bank test signal while said second NMOS transistor receiving, at a gate thereof, a signal inverted from said all-bank test signal via said inverter; and each of said second transmission gates comprises
a third PMOS transistor and a third NMOS transistor coupled in parallel between said input/output comparing unit and said first associated global read data bus line, said third PMOS transistor receiving, at a gate thereof, said signal inverted from said all-bank test signal via said inverter while said third NMOS transistor receiving, at a gate thereof, said all-bank test signal, and a fourth PMOS transistor and a fourth NMOS transistor coupled in parallel between said input/output comparing unit and said second associated global read data bus line, said fourth PMOS transistor receiving, at a gate thereof, said signal inverted from said all-bank test signal via said inverter whereas said fourth NMOS transistor receiving, at a gate thereof, said all-bank test signal.

6. The multi-bank testing apparatus as claimed in claim 1, wherein said input/output comparing unit comprises:

a pair of first PMOS transistors and a pair of first NMOS transistors coupled together in parallel and adapted to receive, at respective gates thereof, a signal inverted by an inverter from an all-bank test signal being enabled when write and read operations in a test mode are to be conducted for all banks;

a plurality of second PMOS transistors coupled in parallel between one of said first PMOS transistors and one of said first NMOS transistors and adapted to receive, at respective gates thereof, input signals;

a second NMOS transistor coupled to one of said first NMOS transistors in such a fashion that they have a common source;

a plurality of third PMOS transistors coupled in parallel between the other one of said first PMOS transistors and the other one of said first NMOS transistors and adapted to receive, at respective gates thereof, input-bar signals;

a third NMOS transistor connected to other one of said first NMOS transistors in such a fashion that they have a common source;

a first NAND gate adapted to receive said input and input-bar signals;

a second NAND gate adapted to receive an output from said first NAND gate at one input thereof, said second NAND gate also receiving said all-bank test signal at the other input thereof; and a third NAND gate adapted to receive an output from said second NAND gate via inverters at one input thereof, said third NAND gate also receiving an output from said second NAND gate via said inverters and then via other inverters, said third NAND gate being coupled at an output thereof to gates of said second and third NMOS transistors in a common fashion via an inverter.

7. The multi-bank testing apparatus as claimed in claim 6, wherein said input and input-bar signals are those output from said input/output sense amplifiers transmitted to the same global read data bus line and enabled in response to the same column address.

8. The multi-bank testing apparatus as claimed in claim 6, wherein said input and input-bar signals are those output from said input/output sense amplifiers associated with the same bank and enabled in response to the same column address.

* * * * *

UNITED STATES PATENT AND TRADEMARK OFFICE
CERTIFICATE OF CORRECTION

PATENT NO. : 6,166,967
DATED : December 26, 2000
INVENTOR(S) : Chang Ho Do

It is certified that error appears in the above-identified patent and that said Letters Patent is hereby corrected as shown below:

Column 7,
Lines 66-67, delete one occurrence of "each bank".

Column 8,
Line 3, change "coupled" to -- couple --.
Lines 10-11, delete entirely.

Signed and Sealed this

Eleventh Day of June, 2002

Attest:

JAMES E. ROGAN
Attesting Officer
Director of the United States Patent and Trademark Office

UNITED STATES PATENT AND TRADEMARK OFFICE
CERTIFICATE OF CORRECTION

PATENT NO. : 6,166,967
DATED : December 26, 2000
INVENTOR(S) : Chang Ho Do

It is certified that error appears in the above-identified patent and that said Letters Patent is hereby corrected as shown below:

Drawings,
Drawing sheet, consisting of Fig. 8, should be added as shown on the attached page.

Signed and Sealed this

Fourth Day of February, 2003

JAMES E. ROGAN
*Director of the United States Patent and Trademark Office*

Fig. 8